United States Patent [19]

Masleid et al.

[11] Patent Number: 4,771,284
[45] Date of Patent: Sep. 13, 1988

[54] LOGIC ARRAY WITH PROGRAMMABLE ELEMENT OUTPUT GENERATION

[75] Inventors: Robert P. Masleid; Martin S. Schmookler, both of Austin, Tex.

[73] Assignee: International Business Machines Corporation, Armonk, N.Y.

[21] Appl. No.: 896,050

[22] Filed: Aug. 13, 1986

[51] Int. Cl.⁴ ............................................. H04Q 1/00
[52] U.S. Cl. ........................... 340/325.83; 340/825.85; 307/465
[58] Field of Search ...................... 340/825.83, 825.85, 340/825.89, 825.9, 825.91; 307/465, 468, 469; 365/103, 104, 218, 189

[56] References Cited

U.S. PATENT DOCUMENTS

| | | | |
|---|---|---|---|
| 3,573,509 | 4/1971 | Crawford | 307/303 |
| 4,165,538 | 8/1979 | Kitamura | 365/104 |
| 4,255,670 | 3/1981 | Griffith | 307/473 |
| 4,276,617 | 6/1981 | Le | 365/189 |
| 4,313,106 | 6/1982 | Hsu | 340/825.91 |
| 4,430,585 | 2/1984 | Kirk, Jr. | 307/473 |
| 4,534,008 | 8/1985 | Fuchs et al. | 340/825.83 X |

OTHER PUBLICATIONS

IBM Technical Disclosure Bulletin, vol. 26, No. 12, 5/84 to J. P. Streck, entitled "Charge-Conserving Bit Line Boost Circuit".

IBM Technical Disclosure Bulletin, vol. 28, No. 9, 2/86 to M. M. Dovek et al., entitled "High Performance CMOS Logic Gate".

Primary Examiner—Ulysses Weldon
Attorney, Agent, or Firm—Thomas E. Tyson

[57] ABSTRACT

A programmable logic array having a plurality of electrically isolated input lines connected to an input circuit for providing an input signal to one of the plurality of input lines. Also included are a plurality of electrically isolated output lines positioned relative to the input lines to form an array having a plurality of non-conductive intersections. A plurality of programmable circuits, each positioned at a selected one of the intersections and interconnecting an adjacent input line, an adjacent output line and one of two output potentials that define one of two output states are provided. The programmable circuit is further connected to the input line such that when an input signal is received on the input line, the selected output potential representing one of the two output states is provided on the output line.

4 Claims, 5 Drawing Sheets

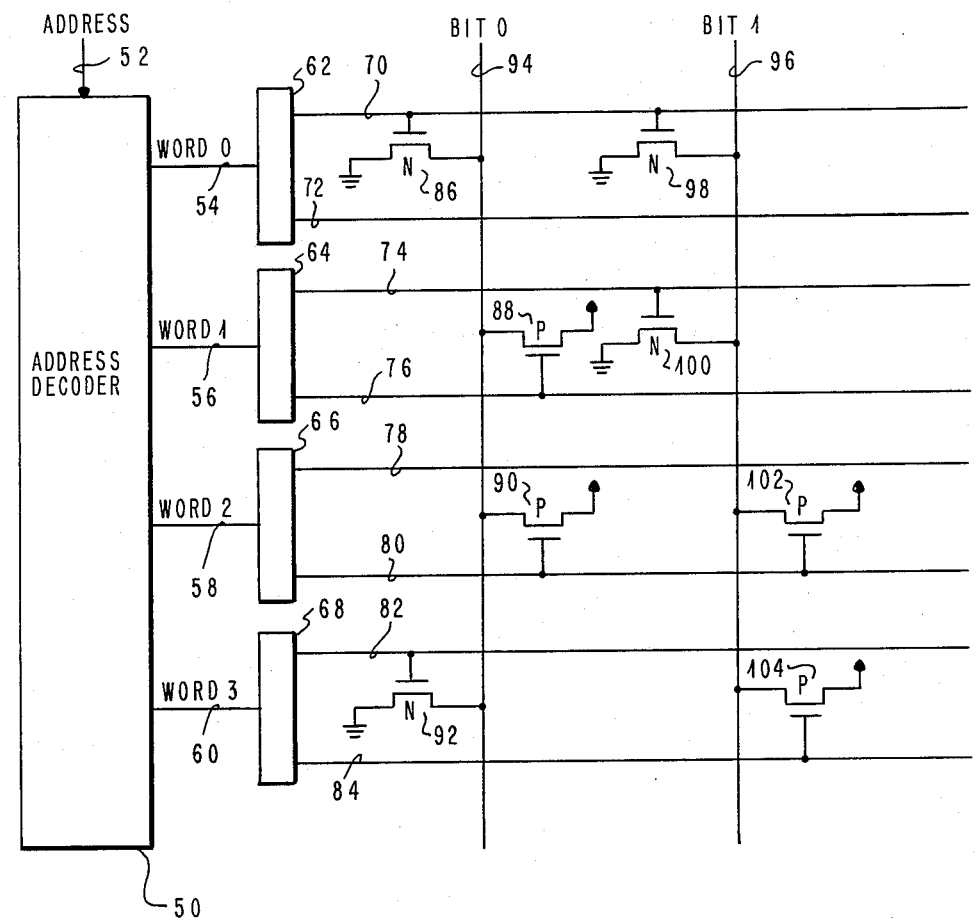
F I G. 2

4,771,284

LOGIC ARRAY WITH PROGRAMMABLE ELEMENT OUTPUT GENERATION

1. Technical Field

This invention relates to programmable logic arrays and more specifically to programmable logic arrays that include individual programmable devices that are implemented in the array to provide output signals.

2. Background Art

Programmable logic arrays are used in digital computers to provide pre-programmed output data. Common types of programmed logic arrays include read-only memories (ROM) and programmed array logic (PAL). Furthermore, the programmed logic arrays are common in microprocessors, microcomputers and micro-controllers for storing data. These programmable logic arrays include a series of parallel word lines that are addressed by an input decoder circuit. An example is the address decode circuit of a ROM that decodes an input address to activate one of a series of word lines of the array. The input lines, word lines, are positioned orthogonally to, but not electrically connecting, a series of parallel bit lines. The bit lines actually provide the output signal from the array. Existing read-only memories provide either pull-up or pull-down resistors tied to these bit lines. These pull-up or pull-down resistors are connected to a voltage source resulting in a voltage potential present on the bit lines. The array itself includes programmable devices that are positioned in selected locations to pull-down or pull-up the potential on the bit line when a selected word line is activated. In this manner, the programmed elements in the array control the output signals present on the bit lines. The absence of a programmable element at an array intersection also provides an output since the absence of the device will result in the intersection bit line being uneffected by a specific word line being selected.

The disadvantage of using pull-up or pull-down resistors is that (1) a significant transition time is present because each bit line must be discharged (if the bit line is to be discharged) before the output of the bit lines can be read, and (2) the array uses DC power whenever the bit lines are active.

It is presently common to implement the programmed logic arrays as an array including field effect transistors such as CMOS type transistors. The pull-up (or pull down) resistors and the programmable devices are both field effect transistors. The pull-up device is configured to function as a resistor. The resistance of the pull-up device together with the switching transistor devices in the programmed logic array result in a ratio voltage divider circuit where the pull-up resistor has a minimum resistance necessary to enable the programmable devices to pull down the voltage level. The higher the voltage level, the longer the transition time required to transition a bit line from one output state to another. Of course, a low output voltage level may be difficult to detect for state transition determination. Therefore, this voltage ratio structure always presents the designer with this tradeoff dilemma.

It is an object of the present invention to provide a programmable logic array with faster access times and lower direct current power requirements.

DISCLOSURE OF THE INVENTION

The present invention provides a means of designing a programmable logic array wherein the output bit lines are actively pulled up or down by the programmable elements as required by the data. In other words, no resistive pull-up or pull-down devices are used. Therefore, the output signals change state faster and the program logic array dissipates power only during output state transition. While this invention may require more area on the surface of a semiconductor device as compared to an equivalent programmed logic array with resistive pull-ups or pull-downs, this disadvantage is offset when faster access time or lower direct current power usage is required and wherein the use of clock load devices or output differential amplifier circuits are not desirable. This invention is intended to be implemented with not only ROMs but also EPROMs, EEROMs and other programmable logic arrays.

In accordance with the present invention, a programmable logic array is provided that includes a plurality of electrically isolated input lines and an input circuit for providing an input signal to one of the input lines. A plurality of electrically isolated output lines positioned relative to the input lines is also provided. These input lines and output lines form non-conductive intersections. Programmable circuits each positioned at the intersections and interconnecting one of two output signal potentials to an adjacent output line and providing an output signal on the output line when an input signal is received on its adjacent connected input line.

In a preferred embodiment, the input lines are orthogonally positioned relative to the output lines and the programmable devices are field effect transistors that are gated by the input lines to provide an output signal on their respective output lines.

In another embodiment of the present invention, each input line is input to a driver circuit that provides a true and complement line output. In this embodiment, a programmable device is provided to either the true line or the complement line on one side and having the other side connected to the respective bit output line. In this embodiment, the transistors that are connected to the true line have a channel of one polarity while the transistors connected to the complement line have channels of an opposite polarity. The transistors connected to the true line are also connected to one of the output potentials and the transistors connected to the complement lines are also connected to the remaining output potential.

In a further embodiment, the input lines are connected to the drivers providing the true and complement line and each bit output line includes two transistors, one connected to the complement line wherein the two transistors for each input line/output line intersection are programmed by connecting the transistors to one of two output potentials.

BRIEF DESCRIPTION OF THE DRAWING

The novel features believed characteristic of the invention are set forth in the appended claims. The invention itself, however, as well as other features and advantages thereof, will be best understood by reference to the following Best Mode for Carrying Out the Invention, when read in conjunction with the accompanying figures, wherein:

FIG. 2 is a schematic diagram of one embodiment of the invention providing field effect transistors connected to true and complement lines of the input line;

BEST MODES FOR CARRYING OUT THE INVENTION

Figure 1:
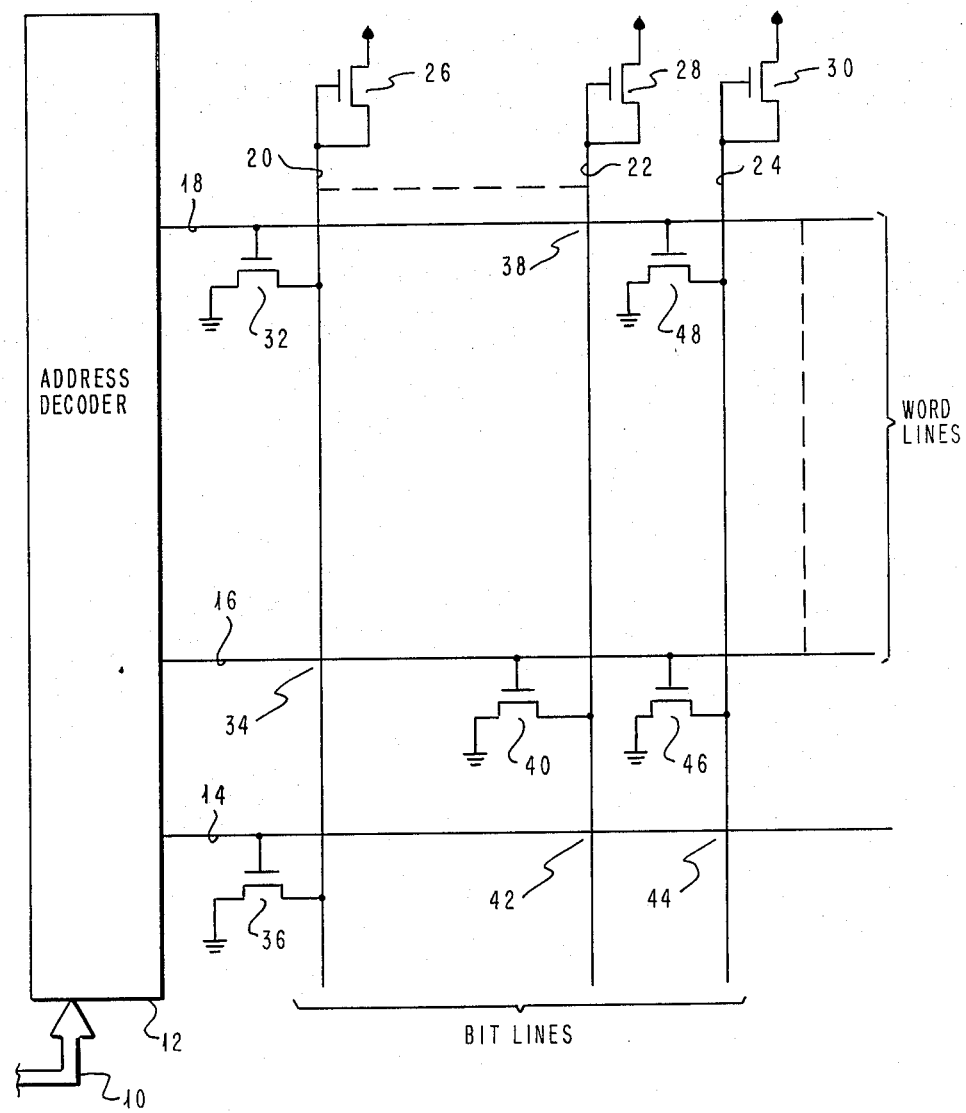
FIG. 1 is a schematic diagram of a prior art logic array implemented with pull-up devices.

This invention requires that only one input line in a logic array be active at any one time. This condition is commonly true for ROMs. It will be also shown that such conditions may be provided for programmable array logic devices (PAL). FIG. 1 represents the prior art method of providing signal output. In FIG. 1, an address decode circuit 12 is provided to receive an input address via lines 10. The address on lines 10 can be either serial or parallel. The received address is decoded by the address decode circuit 12 to activate one of word lines 14, 16, and 18. Word lines 14, 16, and 18 are positioned parallel to each other and orthogonally to a series of bit lines 20, 22, and 24 that provide the output signals for the array. In FIG. 1, three word lines 14, 16 and 18 and three bit lines 20, 22, and 24 are provided. It should be apparent to those skilled in the art that any number of bit lines and/or word lines may be provided. Programming the word line/bit line intersections is provided by placing field effect transistors such as transistors 32, 36, 40, 46 and 48 connecting the word line to the bit line as shown. Furthermore, the transistors 32, 36, 40, 46 and 48 are connected to a ground voltage potential. Intersections 34, 38, 42, and 44 do not include any transistor devices. Additionally, each of the bit lines 20, 22, and 24 include pull-up transistor devices 26, 28 and 30 respectively. As previously discussed, these transistor devices 26, 28 and 30 act as pull-up resistors. In other words, the voltage present at one terminal of the pull-up devices 26, 28 and 30 is provided to the respective bit line. Therefore, before any programming devices such as transistors 32, 36, 40, 46 and 48 are activated, the output on the bit lines 20, 22, and 24 are high or 1.

In operation, when a word line is selected and activated, the voltage on the word line switches the gates of the transistor devices connected to that word line to remove the voltage potential from its respectively connected bit line. For example, if word line 18 was activated, the gates of transistors 32 and 48 would remove the voltage potentials from bit lines 20 and 24 respectively. Therefore, the output on line 20 would be low or a 0, the output of line 22 would be high or a 1, and the output of line 24 would a low or a 0. Note that the output of bit line 22 is high because there is not a transistor present at intersection 38. Therefore, the logic array is programmed by placing the transistors such as transistors 32, 36, 40, 46 and 48 in respective preselected intersections where the output of one state is required and omitting those transistor devices from the intersections where the output of the opposite state is required.

As previously discussed, outputting a 0 will cause a voltage drain since the pull-up resistive device and its connected voltage supply are essentially being connected to ground during the bit line read time thus generating a current drain across the pull-up resistive element and the switching element to ground. Increasing the resistive magnitude of the pull-up resistive device or the switching device will decrease the amount of current drain. However, this will also increase the amount of transition time required before the proper output states can be achieved on the bit lines resulting in slower response time of the programmable logic array.

FIG. 2 illustrates an embodiment of the present invention wherein the word lines 54, 56, 58 and 60 are each connected to drivers 62, 64, 66 and 68 respectively. The output of the drivers 62, 64, 66 and 68 are true and complement lines. The true lines 70, 74, 78 and 82 are connected to the gate of a programmable device having a channel of one polarity while the complement lines 72, 76, 80 and 84 are connected to the gates of transistors having channels of the opposite polarity. Additionally, the true line devices, such as N transistors 86, 92, 98 and 100, are connected to ground while the complement line devices, the P transistors 88, 90, 102 and 104 are connected to a voltage potential. Note that each intersection only includes one transistor. The word lines 54, 56, 58 and 60 are in turn connected to an address decoder 50 that is connected to an address input line 52. The address decoder 50 and address input line 52 function as discussed in FIG. 1. In FIG. 2, the bit lines 94 and 96 are connected to each transistor of its word line intersections. Therefore, if the true side of the word line is high, the presence of a N transistor, such as transistor 86, will drive the bit line 94 low. On the other hand, a complement signal on line 76 will switch transistor 88 to provide a positive voltage potential on bit line 94. Therefore, either state chane for a specific word line will result in a positive voltage potential or ground voltage potential being actively placed on the respective bit line. Since the bit line is either totally discharged by an N transistor, such as transistor 86, or actively charged, such as by transistor 88, no DC power is required after the transition of the word lines.

Also, although the N channel transistors 86, 92, 98 and 100 and the P channel transistors 88, 90, 102 and 104 are shown as if they are in the same cell locations in the array, they may actually be in physically separate arrays with corresponding bit lines connecting together which would reduce the area required for providing isolation between these devices of having channels of opposite polarities. Therefore, the advantages of the circuit illustrated in FIG. 2 is that it provides a fast switching speed with only one device pulling either high or low at the time resulting in no DC power consumption. However, the disadvantage is that more devices, such as the true and complement line drivers and the additional transistors, are required.

Figure 3:
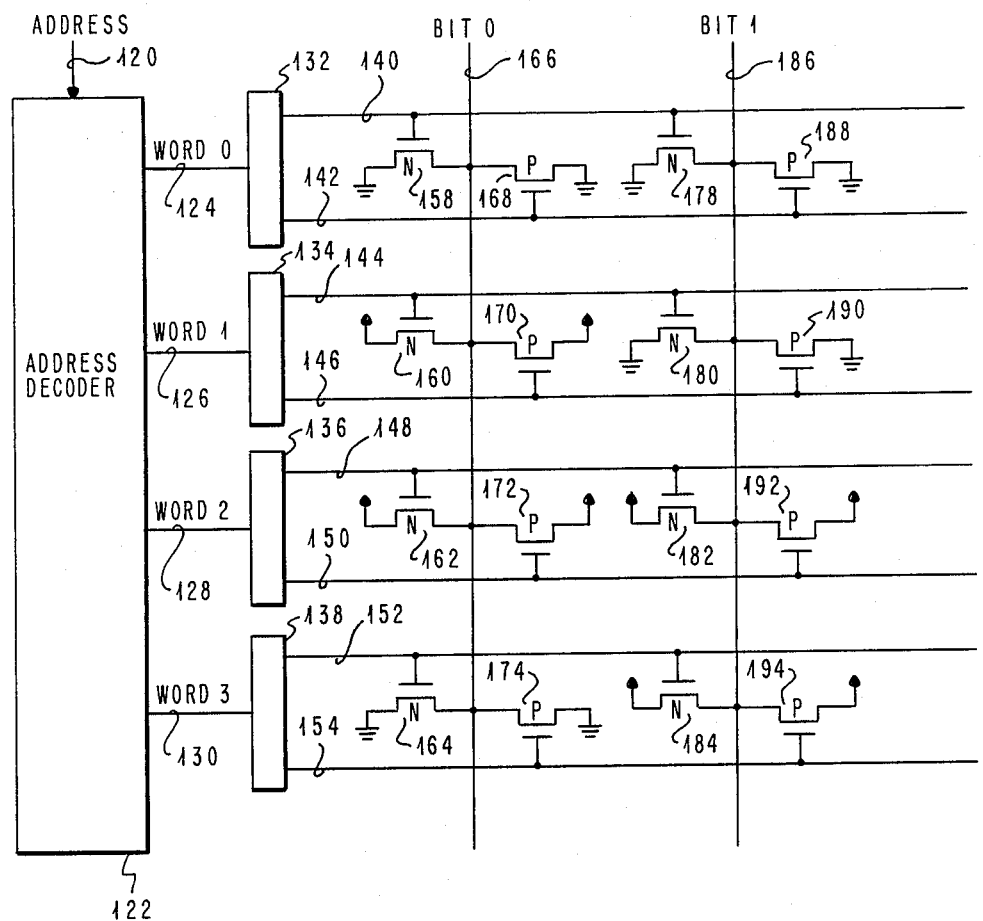
FIG. 3 is a schematic diagram of a second embodiment of the invention wherein each output/input intersection includes two field effect devices.

In FIG. 3, each intersection includes a P channel transistor and a N channel transistor. Both devices are connected to either ground or a positive voltage potential depending on the program data. Thus, both devices help pull either the bit line up or down resulting in faster operation due to this increased drive. The disadvantage is that the capacitance on the bit line is also increased. Another disadvantage may be the greater difficulty is selectively connecting the devices to either ground or the positive voltage potential. However, as in FIG. 2, separate physical arrays may be used for the P channel and N channel devices. Referring to FIG. 3, the address decoder 122 is connected to an address input line 120. The address decoder 122 and address input line 120 function as previously discussed. Word lines 124, 126, 128 and 130 connected to address decoder 120 are also connected to true and complement line drivers 132, 134, 136 and 138 also as previously discussed. Each true line 140, 144, 148 and 152 are connected to N channel transistors 158, 178, and 160, 180 and 162, 182 and 164, 184 respectively. Likewise, the complement lines 142, 146, 150 and 154 are connected to P channel transistor devices 168, 188 and 170, 190 and 172, 192 and 174, 194 respectively. The programming of the intersections is provided by connecting the respective transistors to either the positive voltage potential or ground. Therefore, if word line 124 were selected, the gates of transistors 158 and 168 would be activated pulling bit line 166 down. Likewise, the gates of transistors 178 and 188 would be activated pulling bit line 186 down. Therefore, the output when word line 124 is activated is a 0 on line 166 and a 0 on line 186. If word line 126 was activated, the gates of transistors 160 and 170 would be active placing a voltage potential on line 166. The gates of transistors 180 and 190 would also be activated placing a ground potential on line 186. Therefore, the output on lines 166 and 186 would be 10 respectively.

The advantage of the array in FIG. 3 is that metal layers would be used to program the transistors by connecting the transistors to either ground or the positive voltage level. Also, since all transistors are always present, a faster manufacturing turnaround would result. However, the disadvantages include the fact that a higher number of transistors are required resulting in an additional capacitance.

Figure 4:
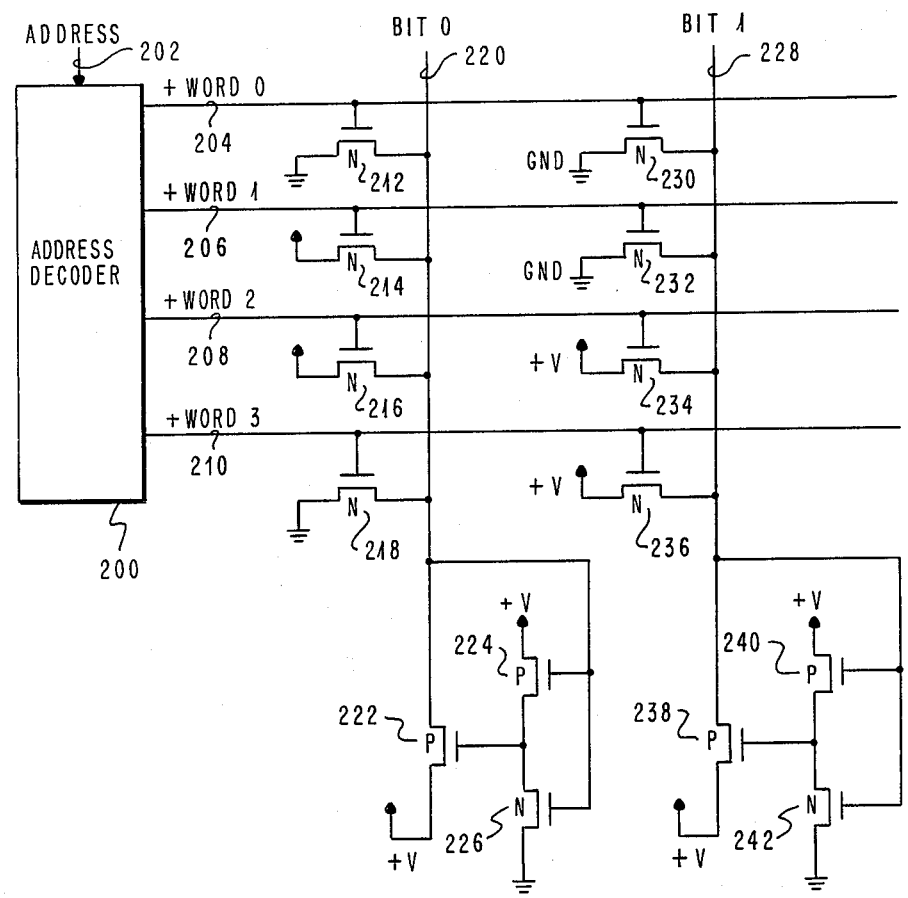
FIG. 4 is a schematic diagram of a third embodiment having the transistors of one polarity positioned in the logic array with output signal energy provided with the array element in conjunction with a switching transistor of opposite polarity.

FIG. 4 includes an array of single N channel transistor devices 212, 214, 216, 218, 230, 232, 234 and 236. Each of these devices are programmed by selectively connecting them to either ground or the positive voltage potential. When the device is connected to the positive voltage potential, it can only pull its output bit line to the voltage potential minus the device threshold voltage. Therefore, some type of output buffer or output amplifier may be needed, such as a differential amplifier, such as is common in RAMs, or an inverter, with device ratios chosen so that the N channel device will overpower the corresponding P channel device when switched. Further, one might use a P channel device with a greater threshold voltage than the N channel device. However, such solutions result in direct current power being dissipated when the bit lines are being read. The solution illustrated in FIG. 4 provides a pull-up P channel transistor with an inverter with the inverter output fed back to the gate of the P channel's device. Thus, once the inverter output is pulled down, the P channel device turns on and pulls the inverter input up.

Referring to FIG. 4 for an example, if the gate of transistor 212 is activated by word line 204, transistor 212 will pull down bit line 220 to the ground potential. However, if word line 206 is activated, the gate of transistor 214 will be activated placing a voltage on bit line 220 that is equal to the original voltage potential connected to transistor 214 minus the threshold voltage of transistor 214. This voltage potential on bit line 220 is sufficient to transition transistor 224 placing a positive voltage potential on the gate of transistor 222 resulting in a voltage present on bit line 220. Note that when transistor 212 is activated grounding bit line 220 that transistor 222 is off thus isolating the bit line 220 at ground potential from the positive voltage potential preventing DC power dissipation during the time that the bit lines are being read. The advantage of the array in FIG. 4 is that the array is compact requiring only N channel devices. Further, no direct current power is dissipated during bit line output. However, the disadvantage is that a ratio design is required since the N channel devices in the array must dominate over the P channel pull-up devices 222 and 238.

Figure 5:
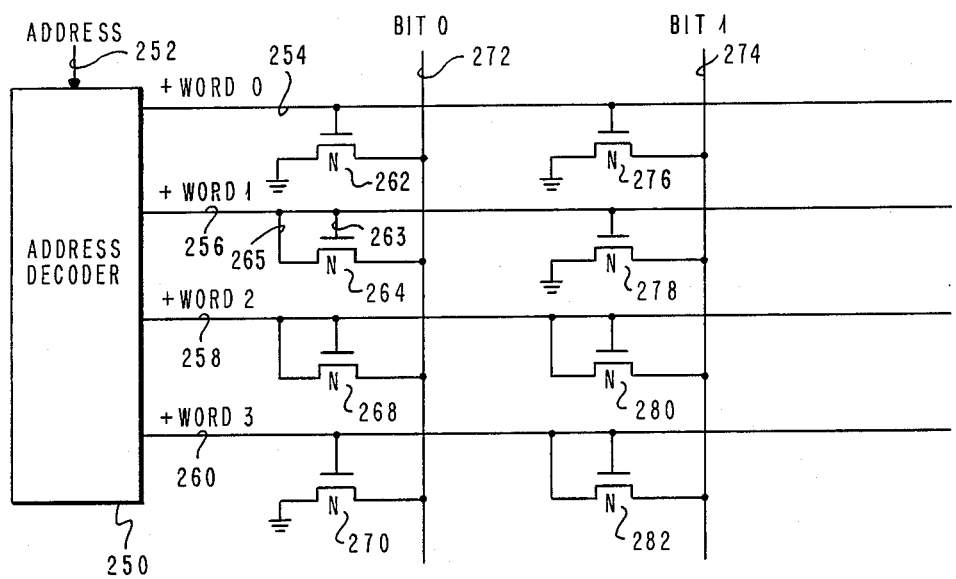
FIG. 5 is a schematic diagram of a fourth embodiment having selected field effect transistors connected to the input line to receive the input signal and output signal energy.

FIG. 5 illustrates a further embodiment of the circuitry in FIG. 4. In FIG. 5, the field effect transistors 262, 270, 276 and 278 each are connected to ground, a word line and a bit line similar to their counterparts in FIG. 4. However, in FIG. 5, transistors 264, 268, 280 and 282 each include terminals that are connected to the word lines instead of a voltage source such as +V in FIG. 4. Specifically, transistor 264 includes a source line 265 that is connected to word line 256. Additionally, transistor 264 includes a gate 263 also connected to the same word line 256. In this embodiment, the respective word line that is active provides the voltage potential for the output signal on the respective bit lines 272 or 274. In the embodiment in FIG. 5, the outputs on lines 272 and 274 are of sufficient power to drive an NMOS channel device. Therefore, no further voltage stabilization need be required if an NMOS device is to be driven. Additionally, a transistor structure such as illustrated in FIG. 4 (including transistors 222, 224, and 226) may also be included to provide extra output voltage on the bit lines 272 and 274. Additionally, lines 272 and 274 may be connected to drive NMOS inverters to provide a higher signal output. The advantage of the configuration in FIG. 5 is that the transistors 264, 268, 280 and 282 do not require independent connections to a voltage such as +V in FIG. 5. However, the word lines 254, 256, 258 and 260 must be capable of providing an adequate output signal for the respective bit lines 272 and 274.

Since programmed array logic or PALs are very similar to ROMs, the programmed array logic inventions as illustrated may be implemented with PALs. In a PAL, the address decoder is equivalent to the product term or AND array. In the PAL, the output of the AND array may activate more than one line. To implement the invention as discussed, the output of the AND array must be constrained such that the output on the product term lines are mutually exclusive, i.e., only one line at a time is active. Therefore, one would require that a PAL whose product terms are not mutually exclusive be redefined so that the product terms are mutually exclusive. This will usually require more AND logic in the AND array. For example, if a PAL contains the output functions $F_1 = a.b$ and $F_2 = c.d$ the product terms a.b and c.d are not mutually exclusive since both would produce an active output when the signal a.b.c.d is 1. However, the functions may be implemented to provide mutually exclusive inputs. For example:

$$F_1 = a.b.c- + a.b.c.d- + a.b.c.d$$

$$F_2 = a.b-.c.d + a.b.c.d + a-.c.d$$

requiring five AND gates, namely (a.b.c−), (a.b.c.d−), (a.b c d), (a.b−.c.d), and (a−.c.d).

Concerning physical layout, it may appear that a satisfactory layout could be achieved by interleaving P channel device columns and N channel device columns or reversing the P channel device and N channel devices for every other bit position so that the P channel devices of one bit were adjacent to the P channel devices of the next bit while the N channel devices are adjacent to the N channel devices of the next bit in the other direction. However, this requires considerable space to provide the appropriate isolation between the N channel devices and the P channel devices (to prevent PNPN latchup). Less space would be needed if separate physical arrays are used as previously discussed having corresponding bit lines connected together with global wiring. A slight disadvantage to this is the extra capacitance due to having the separate bit lines in each array.

Although the invention has been described with reference to these specific embodiments, this description is not meant to be construed in a limiting sense. Various modification of the disclosed embodiments, as well as other embodiments of the invention, will become apparent to those persons skilled in the art upon reference to this Best Mode for Carrying Out the Invention. It is, therefore, contemplated that the appended claims will cover any such modifications or embodiments as may fall within the true scope of the invention.

We claim:

1. A programmable logic array comprising:
   a plurality of parallel positioned electrically isolated input lines;
   input means for providing an input signal on one of said input lines;
   a plurality of parallel positioned electrically isolated output lines collectively positioned orthogonally relative to said input lines forming an array having a plurality of nonconductive intersections of said input lines and said output lines, each intersection including an adjacent input line and an output line; and
   a plurality of programmable means, each positioned at each of said intersections and interconnecting said adjacent input line and output line, said programmable means further connectable to either a first voltage potential or said adjacent input line for providing a programmed output signal of either the first voltage potential or the input signal present on the connected adjacent input line to the connected adjacent output line to define one of two output states when said input signal is received from said connected input line wherein an output potential for either of the two output states is provided only through the progammable means.

2. A programmable array according to claim 1 wherein said programmable means are transistors having a drain terminal connected to the adjacent output line, a gate terminal connected to the adjacent input line and a source terminal programmable connected to either said first voltage potential or said adjacent input line.

3. A programmable array according to claim 2 wherein said first voltage potential is a ground potential.

4. A programmable array according to claim 2 wherein said input means includes an address decoding means for providing said input signal.

* * * * *